(12) United States Patent
Imai

(10) Patent No.: US 6,996,449 B2
(45) Date of Patent: Feb. 7, 2006

(54) SEMICONDUCTOR MANUFACTURING APPARATUS CONTROL SYSTEM

(75) Inventor: Keiji Imai, Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 52 days.

(21) Appl. No.: 10/398,160

(22) PCT Filed: Jul. 31, 2002

(86) PCT No.: PCT/JP02/07798

§ 371 (c)(1),
(2), (4) Date: Apr. 2, 2003

(87) PCT Pub. No.: WO03/012837

PCT Pub. Date: Feb. 13, 2003

(65) Prior Publication Data

US 2004/0031135 A1    Feb. 19, 2004

(30) Foreign Application Priority Data

Jul. 31, 2001    (JP)    .............................. 2001-231969

(51) Int. Cl.
*G06F 19/00*    (2006.01)
(52) U.S. Cl. .............................. 700/121; 438/5; 438/7
(58) Field of Classification Search .................... 438/5, 438/7, 14, 9; 700/121; 716/4
See application file for complete search history.

(56) References Cited

U.S. PATENT DOCUMENTS

| | | | |
|---|---|---|---|
| 6,418,356 B1 * | 7/2002 | Oh | 700/217 |
| 6,594,546 B2 * | 7/2003 | Elger | 700/225 |
| 2002/0155629 A1 * | 10/2002 | Fairbairn et al. | 438/14 |
| 2004/0083021 A1 * | 4/2004 | Somekh et al. | 700/121 |
| 2005/0137734 A1 * | 6/2005 | Nieuwelaar et al. | 700/100 |

FOREIGN PATENT DOCUMENTS

| | | |
|---|---|---|
| JP | 10-125595 | 5/1998 |
| JP | 2001-196283 A | 7/2001 |

* cited by examiner

*Primary Examiner*—Caridad Everhart
(74) *Attorney, Agent, or Firm*—Finnegan, Henderson, Farabow, Garrett and Dunner, L.L.P.

(57) ABSTRACT

To reduce a stop time of transportation of wafers which occurs when one stepper handles many kinds of products, before exposure of semiconductor wafers of a first cassette port 7a is completed, a process recipe for semiconductor wafers of a second cassette port 7b is obtained from a host computer 2, the progress of the exposure of the semiconductor wafers of the first cassette port 7a is detected via a sequencer 5, it is determined, based on the obtained process recipe, whether or not the semiconductor wafers of the second cassette port 7b can be transported to an exposure stage following the last semiconductor wafer of the first cassette port 7a, and a stepper 1 is caused to perform exposure in accordance with the determination result and the progress detection result.

3 Claims, 6 Drawing Sheets

FIG. 4
(a) Prior art
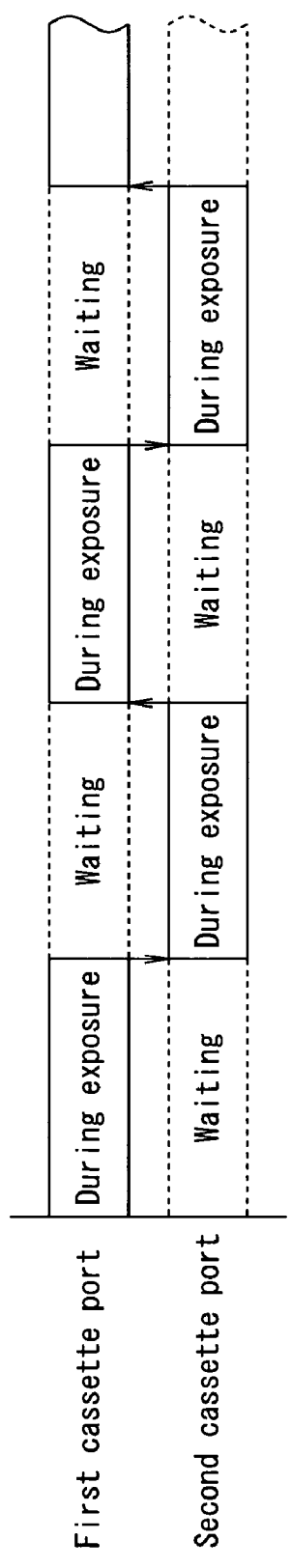
(b) Stepper control system of this embodiment
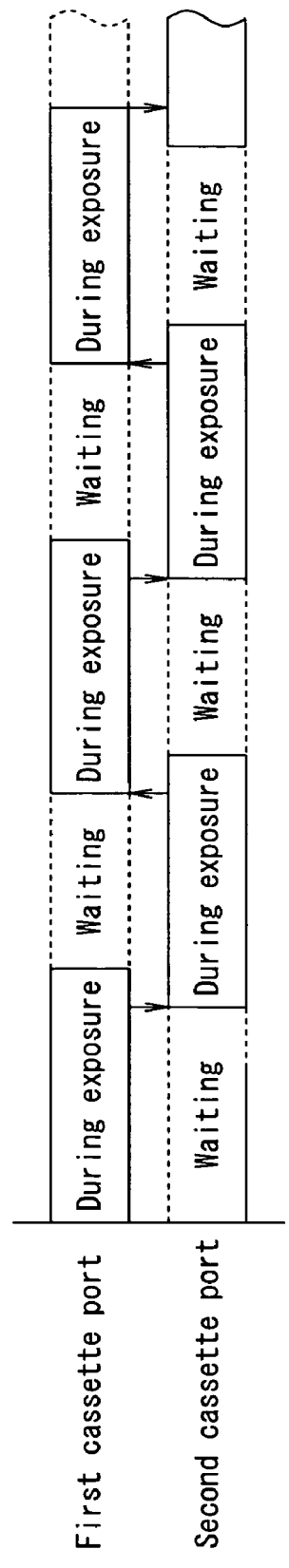

US 6,996,449 B2

SEMICONDUCTOR MANUFACTURING APPARATUS CONTROL SYSTEM

TECHNICAL FIELD

The present invention relates to a control system for a semiconductor manufacturing apparatus that controls the semiconductor manufacturing apparatus, such as a stepper, that transfers a pattern on a reticle to a wafer based on information obtained from a host computer.

BACKGROUND ART

A conventionally known manufacturing line that performs a photolithographic process on a semiconductor device, liquid crystal display element or the like comprises, as shown in FIG. 6, a plurality of steppers 1 and one host computer 2 for controlling the plurality of steppers 1, the steppers and the host computer being connected to each other via a communication line 3.

In such a manufacturing line, each stepper 1 is adapted to perform an exposure process under the control of the host computer 2. First, an operator manipulates an online terminal for the host computer to obtain a process recipe from the host computer 2. Then, after a reticle is set in a reticle library capable of housing a plurality of reticles, according to the process recipe, the operator gives the stepper 1 an instruction to start the process via the terminal and the host computer. Thereby, after automatic replacement of the reticle, the stepper 1 transports a plurality of wafers housed in a predetermined cassette onto an exposure stage one by one, transfers a pattern formed on the reticle to the wafer, and places the wafer having the pattern transferred thereto into the cassette.

The conventional stepper 1 requires the operator to stop transportation of the wafers and perform the terminal manipulation or the like every time exposure of all the wafers processed according to the same process recipe is finished.

Therefore, in the case where a large number of wafers are subject to exposure in the same process recipe as in the case of producing the memory, which was a mainstream of the conventional semiconductor manufacturing industry, that is, in the case where limited kinds of products are to be provided in large quantity, the stepper 1 can perform exposure on wafers housed in different cassettes sequentially without stopping transportation of the wafers, and thus, the availability is high.

However, in recent years, products that can be mass-produced, such as memories, tend to decrease in price, and thus, attentions of many semiconductor manufacturers has been shifted to manufacture of high-value-added custom products. Since the above-described conventional stepper 1 requires manipulation by the operator for a following process every time the process recipe is changed, a time of waiting for the operator manipulation is required. Thus, the stepper 1 is stopped until the operator starts the manipulation for the following process, and thus, there is a possibility that the availability of the stepper 1 is reduced. In particular, in the case where the number of wafers that is processed according to the same process recipe is small (in the case where many kinds of products are to be provided in small quantity), such as in the case of manufacture of a custom product, there is a possibility that the availability of the stepper 1 and thus the throughput thereof are significantly reduced.

Thus, in recent years, there has been developed an arrangement in which a process recipe for a second group of wafers is loaded into the stepper 1 before exposure of a first group of wafers is completed. For example, a known stepper 1 of this type incorporates cassettes each housing wafers processed according to a same process recipe to be adapted for manufacture of many kinds of products in small quantity, obtains from the host computer 2 a process recipe for wafers housed in another cassette before exposure of all the wafers housed in one cassette is completed, and after exposure of the wafers is completed, replaces the reticle with a new one according to the new process recipe and then, starts transportation of the wafers housed in said another cassette.

However, according to the latter conventional technique, since the recipe for the following group of wafers is transmitted to the stepper 1 from the host computer during exposure of the wafers, even if the number of wafers processed according to a same process recipe is small, the availability of the stepper 1 can be prevented from being reduced. However, since transportation of wafers is stopped every time exposure of all the wafers housed in one cassette is completed, for example, even if the wafers processed according to the same process recipe cannot be housed in one cassette and is separately housed in two or three cassettes, transportation of the wafers is stopped every time exposure of the wafers in one cassette is completed. Thus, there is a problem in that the availability of the stepper 1 and thus the throughput thereof is low.

Such problems are not specific to the stepper 1 that performs exposure, and are also found in semiconductor manufacturing apparatus that performs other processes.

The present invention has been devised to solve the problems described above found in the prior art. An object of the invention is to provide a control system for a semiconductor manufacturing apparatus that allows reduction of a stop time of transportation of wafers which occurs when one semiconductor manufacturing apparatus manufactures many kinds of products.

DISCLOSURE OF THE INVENTION

In order to attain the object described above, the present invention is provided as follows. That is, a control system for a semiconductor manufacturing apparatus according to the invention is a control system for a semiconductor manufacturing apparatus that controls a semiconductor manufacturing apparatus that processes wafers housed in a cassette capable of housing a plurality of wafers based on information obtained from a host computer, characterized in that the control system comprises: information obtaining means for obtaining information from said host computer before processing of a first group of wafers housed in a predetermined cassette is completed, the information being to be referenced when processing a second group of wafers, the second group of wafers being housed in a cassette different from said predetermined cassette and processed following said first group of wafers; progress detecting means for detecting the progress of the processing of said first group of wafers from said semiconductor manufacturing apparatus; and processing instructing means for determining, based on the information obtained by said information obtaining means, whether or not said second group of wafers can be transported to a process stage following said first group of wafers and instructing said semiconductor manufacturing apparatus to perform the processing in accordance with the determination result and the detection result by said progress detection means.

Thus, in the control system for a semiconductor manufacturing apparatus according to the invention, before processing of the first group of wafers housed in the predetermined cassette is completed, the information which is to be referenced when processing the second group of wafers housed in a cassette different from the predetermined cassette and processed following the first group of wafers is first obtained from said host computer, and the progress of the processing of the first group of wafers is detected from the semiconductor manufacturing apparatus.

Then, based on the information obtained by said host computer obtaining means, it is determined whether or not said second group of wafers can be transported to the process stage following said first group of wafers. Then, in accordance with the determination result and the progress information detected from the semiconductor manufacturing apparatus, the semiconductor manufacturing apparatus is caused to perform the processing. Therefore, for example, even when wafers to be processed according to a same process recipe cannot be accommodated in one cassette and are separately housed in two or three cassettes, transportation of the wafers can be prevented from being stopped each time processing for one cassette is completed. For example, when processing of the second group of wafers is to be started, if it is determined that the processing need not be changed, the second wafers can be transported to the process stage following the last wafer of the first group of wafers housed in the first cassette. For example, compared with a method in which each time processing of all the wafers housed in a cassette is completed, a process recipe for wafers housed in another cassette is obtained from the host computer 2, the time of communication is eliminated, and the stop time of transportation of wafers can be reduced. Thus, the availability and throughput of the semiconductor manufacturing apparatus can be increased.

Furthermore, it may be provided that when said processing instructing means determines, based on the information obtained by said information obtaining means, that said second group of wafers can be transported to the process stage following said first group of wafers, said processing instructing means instructs said semiconductor manufacturing apparatus to start transportation of said second group of wafers immediately after said semiconductor manufacturing apparatus transports the last wafer of said first group of wafers housed in said predetermined cassette in accordance with the determination result and the detection result by said progress detection means.

With such an arrangement, when it is determined that said second group of wafers can be transported to the process stage following said first group of wafers, said semiconductor manufacturing apparatus starts transportation of said second group of wafers immediately after said semiconductor manufacturing apparatus transports the last wafer of said first group of wafers housed in said predetermined cassette. Therefore, the stop time of transportation of wafers can be eliminated, and the availability and throughput of the semiconductor manufacturing apparatus can be increased.

Besides, in order to attain the object described above, the control system for a semiconductor manufacturing apparatus according to the invention may be a control system for a semiconductor manufacturing apparatus that controls a semiconductor manufacturing apparatus based on information obtained from a host computer, characterized in that the control system comprises: information obtaining means for obtaining information from said host computer before processing of a first group of wafers is completed, the information being to be referenced when processing a second group of wafers which is to be processed following said first group of wafers; progress detecting means for detecting the progress of the processing of said first group of wafers from said semiconductor manufacturing apparatus; and processing instructing means for determining, based on the information obtained by said information obtaining means, whether or not said second group of wafers can be transported to a process stage following the last wafer of said first group of wafers and instructing said semiconductor manufacturing apparatus to perform the processing in accordance with the determination result and the detection result by said progress detection means.

With such an arrangement, before processing of the first group of wafers is completed, the information which is to be referenced when processing the second group of wafers processed following the first group of wafers is first obtained from said host computer, and the progress of the processing of the first group of wafers is detected from the semiconductor manufacturing apparatus. Then, based on the information obtained by said host computer, it is determined whether or not said second group of wafers can be transported to the process stage following said first group of wafers. Then, in accordance with the determination result and the progress information detected from the semiconductor manufacturing apparatus, the semiconductor manufacturing apparatus is caused to perform the processing. Therefore, for example, when processing of the second group of wafers is to be started, if it is determined that the processing need not be changed, the second group of wafers can be transported to the process stage following the last wafer of the first group of wafers. Thus, compared with a method in which whether the processing need be changed or not is determined after the processing of the first wafers is completed, the stop time of transportation of wafers can be reduced, and the availability and throughput of the semiconductor manufacturing apparatus can be increased.

Furthermore, it may be provided that when said processing instructing means determines, based on the information obtained by said information obtaining means, that said second wafers can be transported to the process stage following said first wafers, said processing instructing means instructs said semiconductor manufacturing apparatus to start transportation of said second group of wafers immediately after said semiconductor manufacturing apparatus transports the last wafer of said first group of wafers in accordance with the determination result and the detection result by said progress detection means.

With such an arrangement, when it is determined that said second group of wafers can be transported to the process stage following said first group of wafers, said semiconductor manufacturing apparatus starts transportation of said second group of wafers immediately after said semiconductor manufacturing apparatus transports the last wafer of said first group of wafers. Therefore, the stop time of transportation of wafers can be eliminated, and the availability and throughput of the semiconductor manufacturing apparatus can be increased.

Furthermore it may be provided that said information obtaining means obtains new information from said host computer in accordance with the information obtained by the information obtaining means and the detection result by said progress detecting means.

Furthermore, the control system for a semiconductor manufacturing apparatus according to the invention is particularly effective in controlling a stepper, which is a semiconductor manufacturing apparatus. That is, in order to attain the object described above, the control system for a semiconductor manufacturing apparatus according to the invention may be a control system for a semiconductor manufacturing apparatus that controls a stepper that performs exposure of wafers housed in a cassette capable of housing a plurality of wafers based on information obtained from a host computer, characterized in that the control system comprises: information obtaining means for obtaining information from said host computer before exposure of a first group of wafers housed in a predetermined cassette is completed, the information being to be referenced when performing exposure of a second group of wafers, the second group of wafers being housed in a cassette different from said predetermined cassette and subject to exposure following said first group of wafers; progress detecting means for detecting the progress of the exposure of said first group of wafers from said stepper; and exposure instructing means for determining, based on the information obtained by said information obtaining means, whether or not said second group of wafers can be transported to an exposure stage following said first group of wafers and instructing said stepper to perform exposure in accordance with the determination result and the detection result by said progress detection means.

With such an arrangement, before exposure of the first group of wafers housed in the predetermined cassette is completed, the information which is to be referenced when performing exposure of the second group of wafers which is housed in a cassette different from the predetermined cassette and subject to exposure following the first group of wafers is first obtained from said host computer, and the progress of the exposure of the first group of wafers is detected from the stepper.

Then, based on the information obtained by said host computer, it is determined whether or not said second group of wafers can be transported to the exposure stage following said first group of wafers. Then, in accordance with the determination result and the progress information detected from the stepper, the stepper is caused to perform exposure. Therefore, for example, even when wafers to be processed according to a same process recipe cannot be accommodated in one cassette and are separately housed in two or three cassettes, transportation of the wafers can be prevented from being stopped each time exposure for one cassette is completed. For example, when exposure of the second group of wafers is to be started, if it is determined that the reticle need not be replaced with a new one, the second wafers can be transported to the exposure stage following the last wafer of the first group of wafers housed in the first cassette. For example, compared with a method in which each time exposure of all the wafers housed in a cassette is completed, a process recipe for wafers housed in another cassette is obtained from the host computer 2, the time of communication is eliminated, and the stop time of transportation of wafers can be reduced. Thus, the availability and throughput of the stepper can be increased.

Furthermore, it may be provided that when said exposure instructing means determines, based on the information obtained by said information obtaining means, that said second group of wafers can be transported to the exposure stage following said first group of wafers, said exposure instructing means instructs said stepper to start transportation of said second group of wafers immediately after said stepper transports the last wafer of said first group of wafers housed in said predetermined cassette in accordance with the determination result and the detection result by said progress detection means.

With such an arrangement, when it is determined that said second group of wafers can be transported to the exposure stage following said first group of wafers, said stepper starts transportation of said second group of wafers immediately after said stepper transports the last wafer of said first group of wafers housed in said predetermined cassette. Therefore, the stop time of transportation of wafers can be eliminated, and the availability and throughput of the stepper can be increased.

Besides, in order to attain the object described above, the control system for a semiconductor manufacturing apparatus according to the invention may be a control system for a semiconductor manufacturing apparatus that controls a stepper based on information obtained from a host computer, characterized in that the control system comprises: information obtaining means for obtaining information from said host computer before exposure of a first group of wafers is completed, the information being to be referenced when performing exposure of a second group of wafers which is to be subject to exposure following said first group of wafers; progress detecting means for detecting the progress of the exposure of said first group of wafers from said stepper; and exposure instructing means for determining, based on the information obtained by said information obtaining means, whether or not said second group of wafers can be transported to an exposure stage following the last wafer of said first group of wafers and instructing said stepper to perform exposure in accordance with the determination result and the detection result by said progress detection means.

With such an arrangement, before exposure of the first group of wafers is completed, the information which is to be referenced when performing exposure of the second group of wafers which is subject to exposure following the first group of wafers is first obtained from said host computer, and the progress of the exposure of the first group of wafers is detected from the stepper. Then, based on the information obtained by host computer, it is determined whether or not said second group of wafers can be transported to the exposure stage following said first group of wafers. Then, in accordance with the determination result and the progress information detected from the stepper, the stepper is caused to perform exposure. Therefore, for example, when exposure of the second group of wafers is to be started, if it is determined that the reticle need not be replaced with a new one, the second wafers can be transported to the exposure stage following the last wafer of the first group of wafers. Thus, compared with a method in which whether the reticle need be replaced with a new one or not is determined after the exposure of the first wafers is completed, the stop time of transportation of wafers can be reduced, and the availability and throughput of the stepper can be increased.

Furthermore, it may be provided that when said exposure instructing means determines, based on the information obtained by said information obtaining means, that said second wafers can be transported to the exposure stage following said first wafers, said exposure instructing means instructs said stepper to start transportation of said second group of wafers immediately after said stepper transports the last wafer of said first group of wafers in accordance with the determination result and the detection result by said progress detection means.

With such an arrangement, when it is determined that said second group of wafers can be transported to the exposure stage following said first group of wafers, said stepper starts transportation of said second wafers immediately after said stepper transports the last wafer of said first group of wafers.

Therefore, the stop time of transportation of wafers can be eliminated, and the availability and throughput of the stepper can be increased.

Furthermore, said information obtaining means may obtain new information from said host computer in accordance with the information obtained by the information obtaining means and the detection result by said progress detecting means.

BRIEF DESCRIPTION OF THE DRAWINGS

FIG. 4 illustrates comparison between a stepper operation according to prior art and a stepper operation according to the stepper control system of an embodiment;

BEST MODE FOR CARRYING OUT THE INVENTION

An embodiment of a stepper control system according to the invention will be described below with reference to the drawings.

Figure 1:
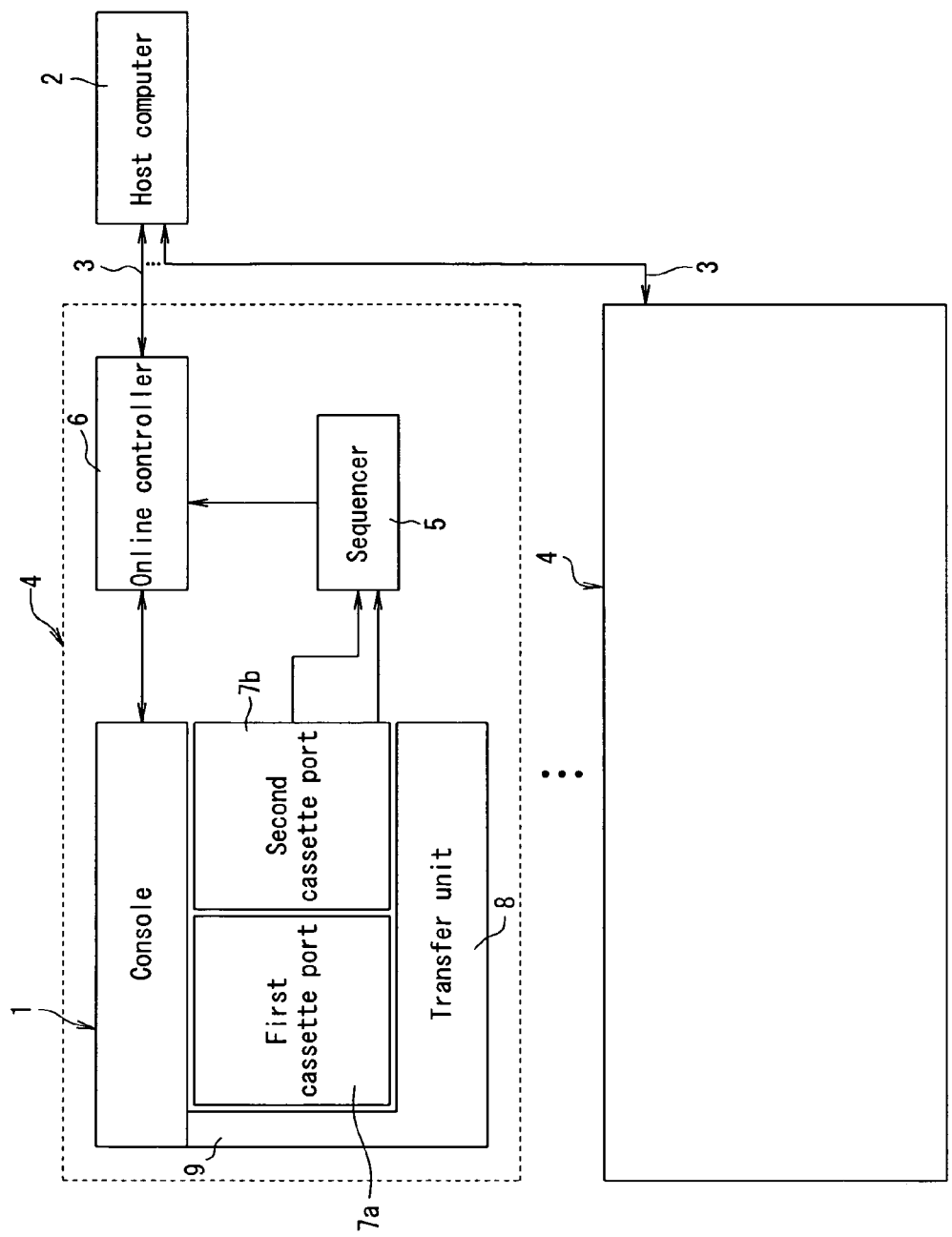
FIG. 1 is a schematic diagram showing an arrangement of a stepper control system according to the invention.

FIG. 1 is a schematic diagram showing an arrangement of the stepper control system according to the invention. As shown in FIG. 1, the stepper control system comprises one host computer 2 storing correspondences between lot numbers and process recipes and a plurality of exposure stations 4 connected to the host computer 2 via a communication line 3.

The exposure station 4 comprises a plurality of devices for obtaining a process recipe from the host computer 2 and sequentially performs exposure. It comprises a stepper 1 for performing exposure of a semiconductor wafer, a sequencer 5 connected to the stepper 1 for detecting the progress of the exposure from the stepper 1, and an online controller 6 connected to the host computer 2, the stepper 1 and the sequencer 5 for obtaining the process recipe from the host computer 2 and the progress information about the exposure from the sequencer 5 and transmitting a control signal generated based thereon to the stepper 1.

The stepper 1 comprises a first cassette port 7a and a second cassette port 7b on each of which a wafer cassette for housing semiconductor wafers can be mounted, a transfer unit 8 with an exposure stage for transferring a pattern on a reticle to the semiconductor wafers housed in the wafer cassettes on the first and second cassette ports 7a and 7b, a wafer transport unit (not shown) for transporting semiconductor wafers between the first and second cassette ports 7a, 7b and the transfer unit 8, and a console 9 for controlling the transfer unit 8, the wafer transport unit and the like.

The sequencer 5 is connected to the first and second cassette ports 7a, 7b and the transfer unit 8 and obtains from the cassette ports 7a, 7b and the transfer unit 8, as progress information of the exposure, states of the first and second cassette ports 7a and 7b (during transportation, during process, process completion, waiting for transportation) and a state of the transfer unit 8 (during process, waiting for process). The online controller 6 is connected to the console 9 and obtains from the console 9 various kinds of condition information including reticle ID, amount of exposure, focus alignment offset.

Furthermore, each wafer cassette houses semiconductor wafers processed according to a same process recipe and has attached thereto a bar code indicating a lot number associated with the process recipe. The bar code on the wafer cassette mounted on the cassette port 7a or 7b is read by a bar code reader connected to the online controller 6.

The wafer transport unit removes a semiconductor wafer from the wafer cassette, transports the same to the transfer unit 8, receives the semiconductor wafer having the pattern transferred thereto from the transfer unit 8 and puts the same back into the wafer cassette.

The console 9 has a function of instructing turning on/off a carrier switch of the cassette port for starting wafer transportation in response to a process start signal transmitted from the online controller 6. If, during exposure of semiconductor wafers housed in the wafer cassette on one of the two cassette ports 7a and 7b, a carrier switch associated with the other of the cassette ports 7a and 7b is turned on, immediately after the last semiconductor wafer is transported from the wafer cassette on the one of the cassette ports 7a and 7b, the wafer transport unit starts transportation of the semiconductor wafers from the wafer cassette on the other of the cassette ports 7a and 7b, and exposure is performed on the semiconductor wafers in the wafer cassette according to the same process recipe.

If, during exposure of semiconductor wafers of the one of the cassette ports 7a and 7b, the online controller 6 receives a process recipe different from that being executed from the host computer and the other of the cassette ports 7a and 7b has a wafer cassette mounted thereon, immediately after the pattern transfer to all the wafers in the wafer cassette on the one of the cassette ports 7a and 7b is completed, the received different process recipe is transferred from the online controller to the console 9, and then, after replacement of the reticle or the like is completed, the process for the other of the cassette ports 7a and 7b is started.

In the case where, when any exposure has not been not performed after the transfer unit 8 is powered on, a new process recipe is received from the online controller 6 and one of the cassette ports 7a and 7b has a wafer cassette mounted thereon, the transfer unit 8 starts replacement of the reticle or the like according to the received new process recipe.

Figure 2:
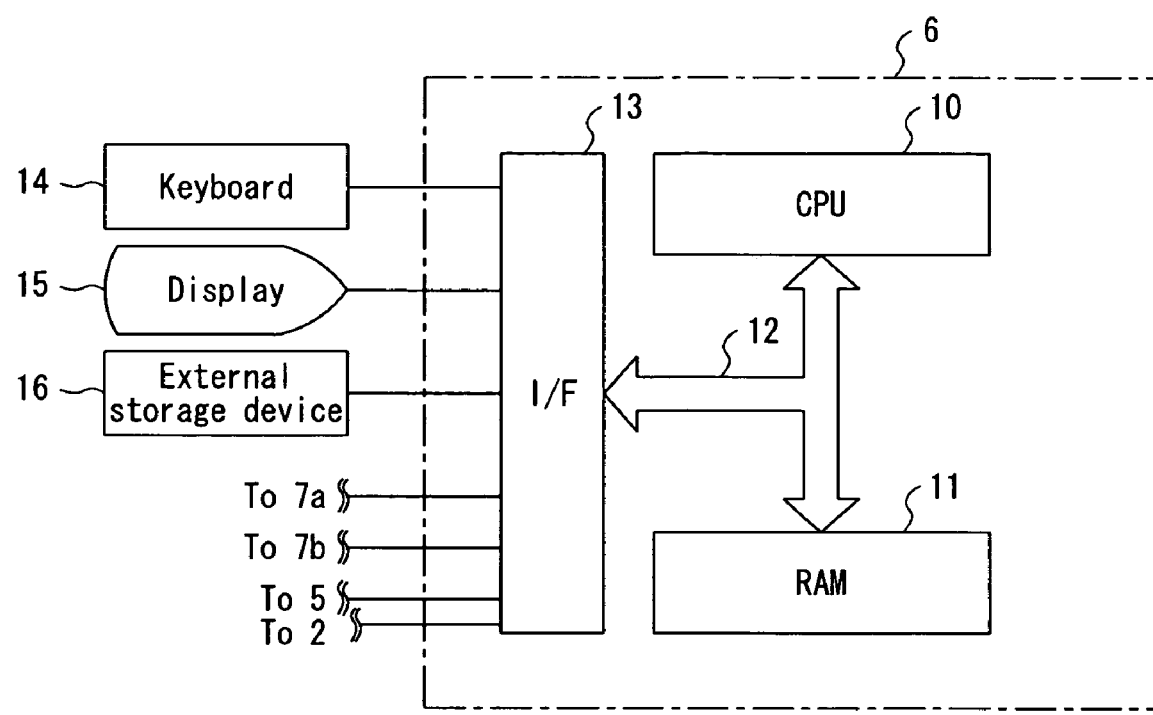
FIG. 2 is a block diagram showing an arrangement of an online controller shown in FIG. 1.

FIG. 2 is a block diagram showing an arrangement of the online controller 6 shown in FIG. 1. The online controller 6 comprises a CPU 10 and a RAM 11 for storing a program or the like that is executed by the CPU 10, the CPU 10 and the RAM 11 being connected to each other via a bus 12. To the CPU 10, a keyboard 14, a display 15, an external storage device 16, a bar code reader for the first and second cassette ports 7a and 7b, the console 9, the sequencer 5 and the host computer 2 are connected via the bus 12 and an interface 13.

The CPU 10 executes the program stored in the RAM 11. Thereby, when exposure of the semiconductor wafers of one of the cassette ports 7a and 7b is performed according to the detection result by the sequencer 5 and the information obtained from the console 9, the CPU 10 transmits to the console 9 the process recipe for the semiconductor wafers of the other of the cassette ports 7a and 7b and a signal to turn on the carrier switch of the other of the cassette ports 7a and 7b.

In the case where the first and second cassette ports 7a and 7b has mounted thereon cassettes for which exposure is performed according to the same process recipe, when exposure of the semiconductor wafers of one of the cassette ports 7a and 7b is being performed based on the detection result by the sequencer 5 and the information obtained from the console 9, only the signal to turn on the carrier switch of the other of the cassette ports 7a and 7b is transmitted to the console 9.

The program described above is stored in the external storage device 16. The program is transferred to the RAM 11 when it is to be executed and executed by the CPU 10 with a predetermined control period ΔT (for example, 10 msec).

Figure 3:
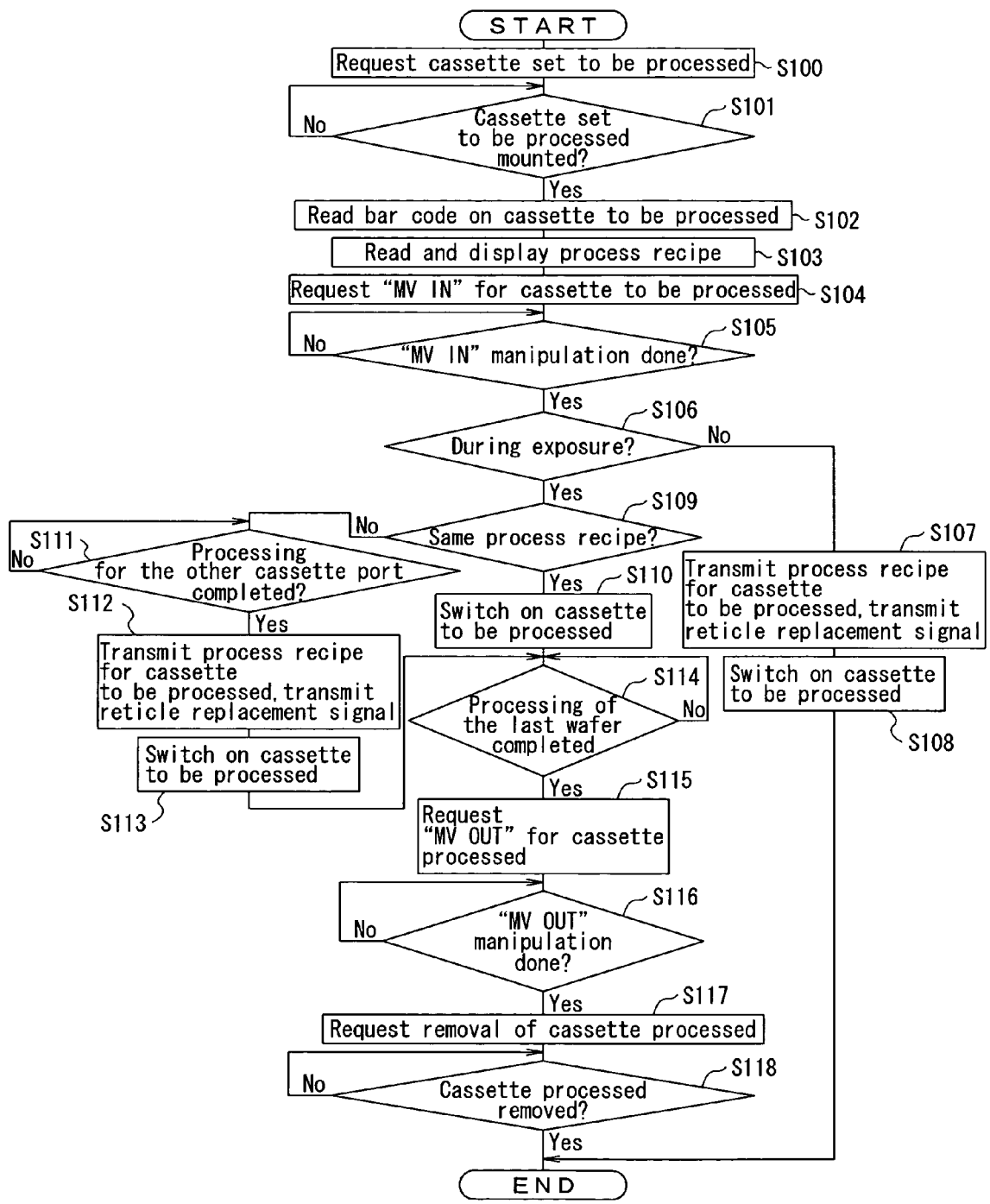
FIG. 3 is a flow chart of a computation process executed by the online controller shown in FIG. 1.

A computation process of the program is shown in a flow chart in FIG. 3. First, in step S100, a message to prompt the operator to mount a new wafer cassette on an available one of the first and second cassette ports 7a and 7b is shown on the display 15, and then the process continues to step S101.

In step S101, based on the detection result by the sequencer, it is determined whether or not a new wafer cassette is mounted on the cassette port 7a or 7b for which the message which prompts mounting of the wafer cassette is displayed in step S100. If the wafer cassette is mounted on the cassette port (Yes), the process continues to step S102. If the wafer cassette is not mounted thereon (No), the determination is performed again.

In step S102, the bar code reader connected to the online controller reads the lot number from the bar code attached to the new wafer cassette, and then, the process continues to step S103.

In step S103, a process recipe associated with the lot number read in step S102 is loaded from the host computer 2, and the process recipe is displayed on the display 15. Then, the process continues to step S104.

In step S104, a message is displayed on the display 15 which prompts the operator to manipulate a predetermined key of the keyboard 14 after performing a manipulation "MV IN", which indicates that exposure of the semiconductor wafers housed in the new wafer cassette can be performed according to the process recipe displayed on the display 15 in step S103. Then, the process continues to step S105.

In step S105, it is determined whether or not the predetermined key of the keyboard 14 which is prompted to be manipulated in step S104 is manipulated. If the key is manipulated (Yes), the process continues to step S106. If the key is not manipulated (No), the determination is repeatedly performed.

In step S106, based on the detection result by the sequencer 5, it is determined whether the semiconductor wafers are being subject to exposure or not. If the semiconductor wafers are being subject to exposure (Yes), the process continues to step S109. If the semiconductor wafers are not being subject to exposure (No), the process continues to step S107.

In step S107, the process recipe loaded in step S103 and a reticle replacement signal are transmitted to the console 9. Then, the process continues to step S108.

In step S108, a signal to turn on the carrier switch associated with the cassette port 7a or 7b on which the wafer cassette is mounted by the operator in step S100 is transmitted to the console 9, and then, the computation process is ended.

On the other hand, in step S109, a process condition of the exposure being performed is obtained from the console 9, and it is determined whether or not the process condition is the same as the process recipe loaded in step S103. If the process condition is the same as the recipe (Yes), the process continues to step S110. If the process condition is not the same as the recipe (No), the process continues to step S111.

In step S110, a signal to turn on the carrier switch associated with the cassette port 7a or 7b on which the wafer cassette is mounted by the operator in step S100 is transmitted to the console 9, and then, the process continues to step S114.

On the other hand, in step S111, based on the detection result by the sequencer 5 and a process end signal from the console 9, it is determined whether the wafer processing of all the wafers in the wafer cassette which houses the group of semiconductor wafers being subject to exposure is completed or not. If the processing is completed (Yes), the process continues to step S112. If the processing is not completed (No), the determination is repeatedly performed.

In step S112, the process recipe loaded in step S103 and the reticle replacement signal is transmitted to the console 9, and then, the process continues to step S113.

In step S113, a signal to turn on the carrier switch associated with the cassette port 7a or 7b on which the wafer cassette is mounted by the operator in step S100 is transmitted to the console 9, and then, the process continues to step S114.

In step S114, based on the detection result by the sequencer 5, it is determined whether or not the last semiconductor wafer having been subjected to exposure is transported into the wafer cassette housing the group of semiconductor wafers being subject to exposure. If the last semiconductor wafer is transported into the wafer cassette (Yes), the process continues to step S115. If the last semiconductor wafer is not transported into the wafer cassette (No), the determination is performed again.

In step S115, the operator is requested to perform a manipulation "MV OUT" to reconfirm the process condition for all the semiconductor wafers having been subject to exposure and confirm the number of wafers processed, and then, a message is displayed on the display 15 which prompts the operator to manipulate a predetermined key of the keyboard 14. Then, the process continues to step S116.

In step S116, it is determined whether or not the predetermined key of the keyboard 14 which is prompted to be manipulated in step S115 is manipulated. If the key is manipulated (Yes), the process continues to step S117. If the key is not manipulated (No), the determination is performed again.

In step S117, a message is displayed on the display 15 which prompts the operator to remove the wafer cassette housing the semiconductor wafers having been subject to exposure from the first or second cassette port 7a or 7b. Then, the process continues to step S118.

In step S118, it is determined whether or not the wafer cassette that is requested to be removed is removed from the first or second cassette port 7a or 7b in step S117. If the wafer cassette is removed (Yes), the computation process is ended. If the wafer cassette is not removed (No), the determination is performed again.

Now, with reference to a specific situation, an operation of the stepper control system of the invention which is used in a factory that manufactures many kinds of products in small quantity, for example, manufactures custom products will be described.

First, suppose an operator in the factory powers on the stepper 1, the host computer 2 and the online controller 6, and then, after a lapse of a predetermined control period ΔT, the program stored in a predetermined area in the RAM 11 is activated. Then, in step S100, a message to prompt the operator to mount a new wafer cassette on an available one of the first and second cassette ports 7*a* and 7*b* is displayed on the display 15. However, since the new wafer cassette has not been mounted at the point in time when the message is displayed, the determination in step S101 results in "No", and the determination in step S101 is repeatedly performed.

Suppose the operator sees the message on the display 15 and mounts a new wafer cassette on the first cassette port 7*a* complying with the message. Then, the sequencer 5 detects the wafer cassette mounted on the first cassette port 7*a*, and the determination in step S101 results in "Yes". In step S102, the bar code reader connected to the online controller reads the lot number from the bar code attached to the new wafer cassette. In step S103, a process recipe associated with the lot number read in step S102 is loaded from the host computer 2 and displayed on the display 15. In step S104, a message to prompt the operator to manipulate a predetermined key of the keyboard 14 after performing "MV IN" is displayed on the display 15. However, since the predetermined key has not been manipulated at the point in time when the message is displayed, the determination in step S105 result in "No", and the determination in step S105 is repeatedly performed.

Suppose the operator sees the message on the display 15 and manipulates the predetermined key after performing "MV IN" complying with the message. Then, the determination in step S105 results in "Yes". Besides, since the computation process is performed for the first time since the online controller 6 has been powered on, the determination in step S106 results in "No". In step S107, the process recipe loaded in step S103 and a reticle replacement signal is transmitted to the console 9. Instep S108, a signal to turn on the carrier switch associated with the first cassette port 7*a* is transmitted to the console 9, and then, the computation process is ended.

The console 9 having received the new process recipe from the online controller 6 and the signal to turn on the carrier switch associated with the first cassette port 7*a* makes the transfer unit 8 replace the reticle according to the received process recipe and so on and then makes the wafer transport unit start transportation of the semiconductor wafers from the wafer cassette on the first cassette port 7*a*.

Suppose the program stored in the predetermined area in the RAM 11 is activated again after a lapse of the predetermined control period ΔT after the end of the preceding computation process. Then, in step S100, a message to prompt the operator to mount a new wafer cassette on the second cassette port 7*b* is displayed on the display 15. However, since the new wafer cassette has not been mounted at the point in time when the message is displayed, the determination in step S101 results in "No", and the determination in step S101 is repeatedly performed.

Suppose the operator sees the message on the display 15 and mounts a new wafer cassette on the second cassette port 7*b* complying with the message. Then, the sequencer 5 detects the wafer cassette mounted on the second cassette port 7*b*, and the determination in step S101 results in "Yes". In step S102, the bar code reader connected to the online controller reads the lot number from the bar code attached to the new wafer cassette. In step S103, a process recipe associated with the lot number read in step S102 is loaded from the host computer 2 and displayed on the display 15. In step S104, a message to prompt the operator to manipulate a predetermined key of the keyboard 14 after performing "MV IN" is displayed on the display 15. However, since the predetermined key has not been manipulated at the point in time when the message is displayed, the determination in step S105 result in "No", and the determination in step S105 is repeatedly performed.

Suppose the operator sees the message on the display 15 and manipulates the predetermined key after performing "MV IN" complying with the message. Then, the determination in step S105 results in "Yes". Besides, since the semiconductor wafers of the first cassette port 7*a* are being subject to exposure, the determination in step S106 results in "Yes".

Here, it is supposed that the process recipe loaded in step S103 is different from that loaded in the preceding computation process. Then, the determination in step S109 results in "No", the determination in step S111 results in "No", and the determination in step S111 is repeatedly performed.

Suppose processing of all the wafers of the wafer cassette mounted on the first cassette port 7*a* is completed when the determination in step S111 is being repeatedly performed. Then, the determination in step S111 results in "Yes". In step S112, the process recipe loaded in step S103 and the reticle replacement signal are transmitted to the console 9. In step S113, the signal to turn on the carrier switch associated with the second cassette port 7*b* is transmitted to the console 9.

The console 9 having received the new process recipe and reticle replacement signal from the online controller 6 and been instructed to turn on the carrier switch associated with the second cassette port 7*b* receives the process recipe and reticle replacement signal for the second cassette port 7*b* from the online controller and starts replacement of the reticle according to the process recipe immediately after pattern transfer for the wafer cassette on the first cassette port 7*a* is completed.

In this way, if it is determined that the reticle needs to be replaced with a new one to start exposure of the semiconductor wafers of the second cassette port 7*b*, replacement of the reticle is started immediately after the last semiconductor wafer is transported into the wafer cassette on the first cassette port 7*a*. Therefore, unlike the method of performing the MVIN manipulation for the following different process recipe via an operator manipulation after transportation of the semiconductor wafers is completed, there is no waiting time for the operator manipulation, and thus, the availability and throughput of the stepper are increased.

Furthermore, suppose the semiconductor wafers processed according to a same process recipe cannot be accommodated in one wafer cassette, and the wafer cassette mounted on the second cassette port 7*b* also houses the semiconductor wafers subjected to exposure according to the same process recipe as that for the wafer cassette mounted on the first cassette port 7*a*. Then, the determination in step S109 results in "Yes", and in step S110, the signal to turn on the carrier switch associated with the second cassette port 7*b* is transmitted to the console 9.

Then, when the carrier switch associated with the second cassette port 7*b* is turned on, the cassette port 7*b* makes the wafer transport unit start transportation of the semiconductor wafers from the wafer cassette on the second cassette port 7*b* immediately after the last semiconductor wafer is transported from the wafer cassette on the first cassette port 7*a*.

In this way, when it is determined that the reticle does not need to be replaced with a new one to start exposure of the semiconductor wafers of the second cassette port 7*b*, transportation of the semiconductor wafers of the second cassette ports 7*b* is started immediately after the semiconductor wafers of the first cassette port 7*a* are transported. Therefore, there is no stop time of transportation of the semiconductor wafers, and thus, the availability and throughput of the stepper are increased.

Besides, if the process proceeds to step S114 via step S110 or S113, the determination in step S114 results in "No", and the determination is repeatedly performed.

Suppose the last semiconductor wafer is transported from the wafer cassette mounted on the first cassette port 7a when the determination in step S114 is being repeatedly performed. Then, the determination in step S114 results in "Yes". And in step S115, a message to prompt the operator to manipulate a predetermined key of the keyboard 14 after performing "MV OUT" is displayed on the display 15. However, since the predetermined key has not been manipulated at the point in time when the message is displayed, the determination in step S116 result in "No", and the determination in step S116 is repeatedly performed.

Suppose the operator sees the message on the display 15 and manipulates the predetermined key after performing "MV OUT" complying with the message. Then, in step S117, a message to prompt the operator to remove the wafer cassette housing the semiconductor wafers having been subject to exposure from the first cassette port 7a is displayed on the display 15. However, since the wafer cassette has not been removed at the point in time when the message is displayed, the determination in step S118 results in "Yes", and the determination in step S118 is repeatedly performed.

If the operator having seen the message on the display 15 removes the wafer cassette complying with the message, the determination in step S118 results in "Yes", and the computation process ends.

Figure 5:
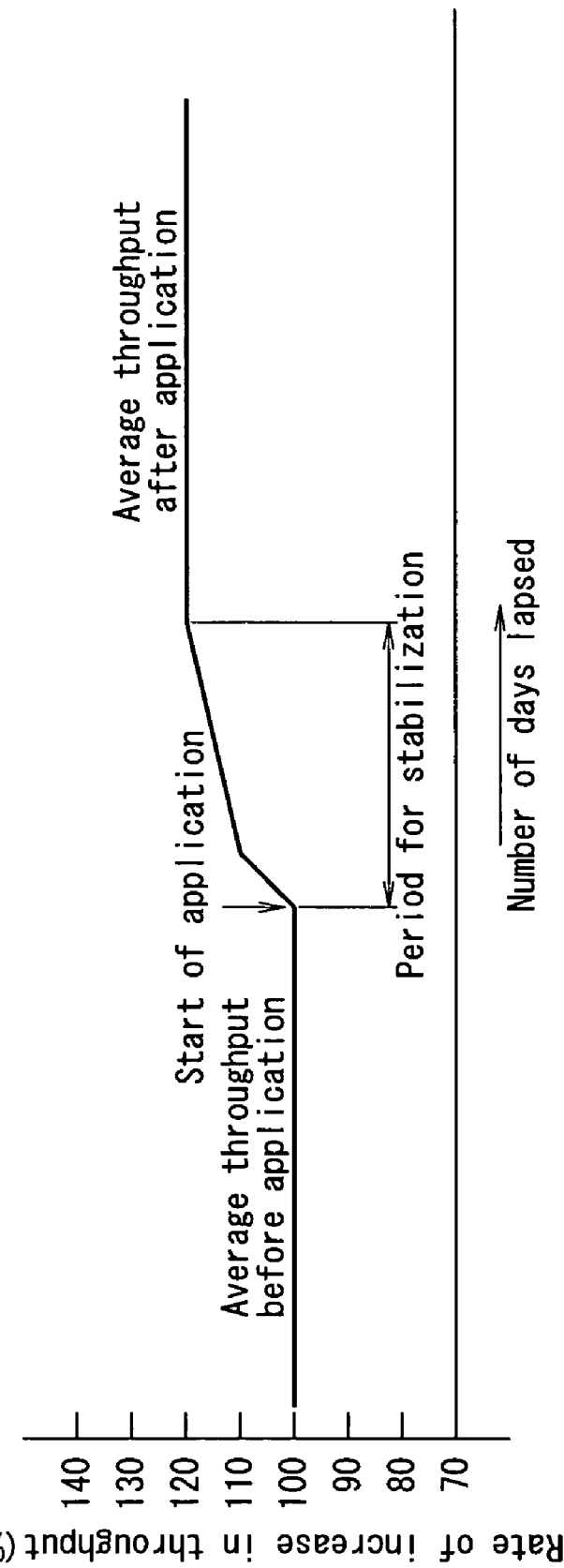
FIG. 5 illustrates comparison between a throughput according to prior art and a throughput according to the stepper control system of the embodiment.
Figure 6:
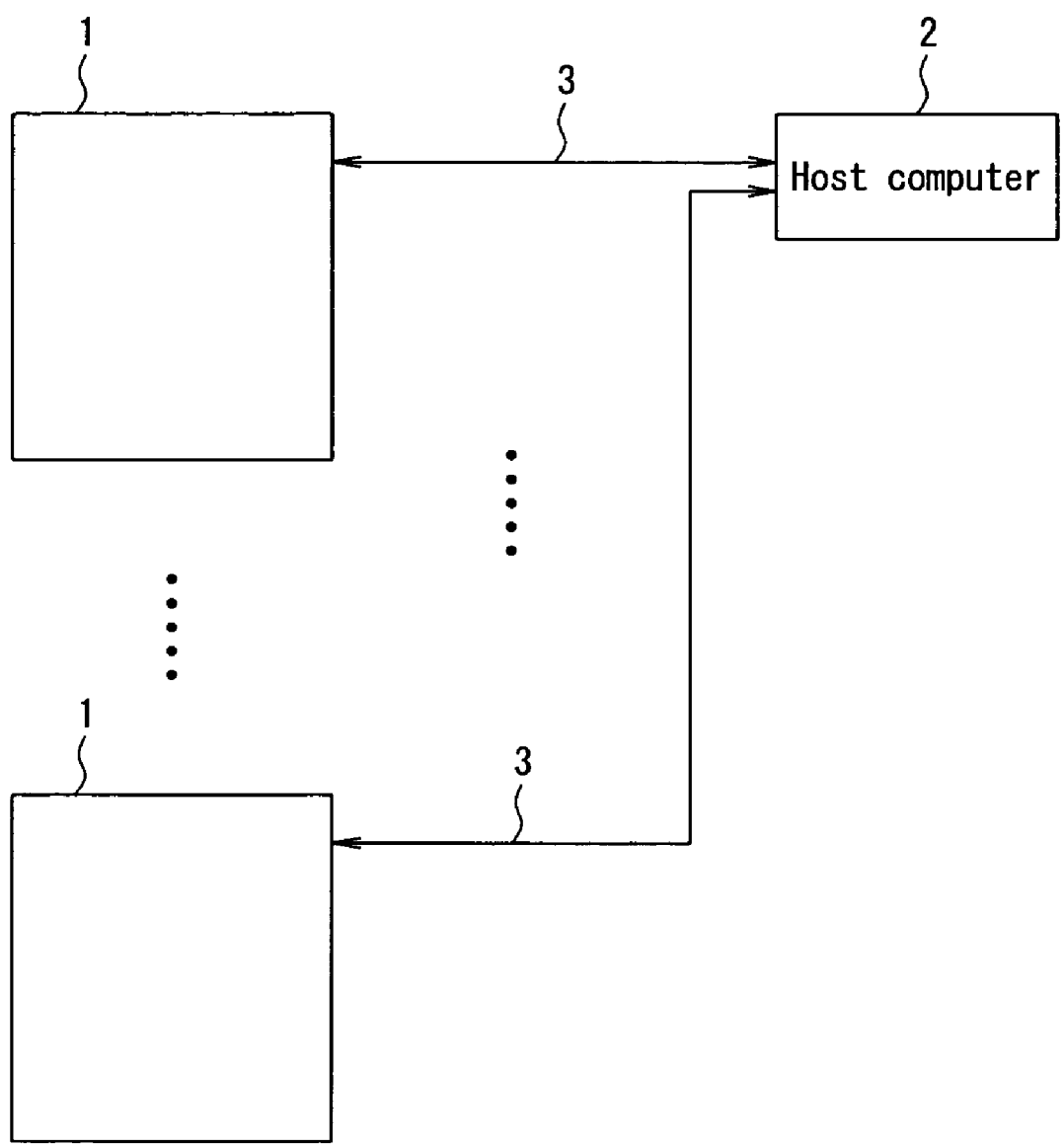
FIG. 6 is a schematic diagram showing an arrangement of a conventional stepper control system.

By repeating the flow described above, as shown in FIG. 4, compared with the conventional technique in which after exposure of the semiconductor wafers of one of the cassette ports 7a and 7b is completed, exposure of the semiconductor wafers of the other of the cassette ports 7a and 7b is started, the availability of the stepper is increased, and the throughput thereof is also increased as shown in FIG. 5.

In this embodiment, the online controller 6 and step S103 are equivalent to information obtaining means, the sequencer 5 is equivalent to the progress detection means and the online controller 6 and steps S109 to S115 are equivalent to exposure instructing means.

In addition, the embodiment described above is only an example of the stepper control system according to the invention, the arrangement of the system or the like are not limited thereto.

For example, in the embodiment described above, if the process recipe transmitted from the host computer 2 is the same as the process condition of the current exposure processing, immediately after the last semiconductor wafer is transported from the wafer cassette on the first cassette port 7a, the wafer transport unit starts transportation of the semiconductor wafers from the wafer cassette on the second cassette port 7b. However, the timing of starting transportation of the semiconductor wafers from the second cassette port 7b is not limited to that immediately after the last semiconductor wafer is transported from the wafer cassette on the first cassette port 7a. It is essential only that the timing precedes the transportation of the last semiconductor wafer having the pattern transferred thereto into the wafer cassette.

Furthermore, in the example described above, one wafer cassette houses a plurality of semiconductor wafers processed according to a same process recipe. However, one wafer cassette may house a plurality of semiconductor wafers processed according to different process recipes. In such a case, when each semiconductor wafer is transported from the wafer cassette, it maybe determined whether or not the process recipe for the wafer is the same as that for the preceding one.

Furthermore, in the example described above, there are provided two cassette ports 7a and 7b, and when the semiconductor wafers housed in the wafer cassette on one of the cassette ports 7a and 7b are being subject to exposure, the process recipe for the semiconductor wafers of the other of the cassette ports 7a and 7b is obtained. However, for example, in the case where three or more cassette ports are provided, when the semiconductor wafers of one of the cassette ports being subject to exposure, the process recipes for the semiconductor wafers of all the other cassette ports may be obtained.

In the case where all the process recipes are to be obtained, for example, rather than in the order in which the wafer cassettes are mounted on the cassette ports, a semiconductor wafer for which the process recipe is less changed may be subject to exposure by priority.

Furthermore, in the example described above, the online controller 6 obtains the process state in the transfer unit 8 via the console 9. However, the online controller 6 may directly obtain the process state from the transfer unit 8. Alternatively, a microcomputer dedicated to obtain the process state is provided, and the online controller 6 may obtain the process state from the transfer unit 8 via the microcomputer rather than via the console 9.

Furthermore, the microcomputer may have a function similar to that of the online controller 6, or the console 9 may have a function similar to that of the online controller 6. Alternatively, the host computer 2 may have a function similar to that of the online controller 6.

Furthermore, the console 9 may have the functions of the online controller 6 and host computer 2.

INDUSTRIAL APPLICABILITY

As described above, the control system for a semiconductor manufacturing apparatus according to the invention is adapted to determine whether, following a first group of wafers housed in a predetermined cassette, a second group of wafers housed in a cassette different from the predetermined cassette can be transported to a process stage or not based on information obtained from a host computer. Therefore, for example, when processing of the second group of wafers is to be started, if it is determined that the processing need not be changed, the second wafers can be transported to the process stage following the last one of the first wafers housed in the first cassette. Thus, the stop time of transportation of wafers can be reduced, and the availability and throughput of the semiconductor manufacturing apparatus can be increased.

What is claimed is:

1. A control system for a semiconductor manufacturing apparatus that controls a stepper based on information obtained from a host computer, comprising:
means for detecting the progress of the exposure of a first group of wafers from said stepper;
means for obtaining information from said host computer before exposure of the first group of wafers is completed, the information obtained to be referenced when performing exposure of a second group of wafers which is to be subject to exposure following said first group of wafers;
means for determining, based on the information obtained by said means for obtaining information, whether or not said second group of wafers can be transported to an exposure stage following the last wafer of said first group of wafers and instructing said stepper to perform the exposure in accordance with the determination result and the detection result by said means for detecting progress; and when said means for determining determines, based on the information obtained by said means for obtaining information, that said second group of wafers can be transported to the exposure stage following said first group of wafers, said means for instructing instructs said stepper to start transportation of said second group of wafers immediately after said stepper transports the last wafer of said first group of wafers in accordance with the determination result and the detection result by said means for detecting progress.

2. The control system for a semiconductor manufacturing apparatus according to claim 1, wherein said first group of wafers and said second group of wafers are housed in a predetermined cassette and a cassette different from said predetermined cassette, respectively.

3. The control system for a semiconductor manufacturing apparatus according to claim 1 or 2, wherein said means for obtaining information obtains new information from said host computer in accordance with the information obtained by the means for obtaining information and the detection result by said means for detecting progress.

* * * * *